United States Patent [19]
Elms

[11] Patent Number: 5,394,018
[45] Date of Patent: Feb. 28, 1995

[54] MICROPROCESSOR BASED ELECTRICAL APPARATRUS WITH FALSE AC INPUT REJECTION

[75] Inventor: Robert T. Elms, Monroeville Boro, Pa.

[73] Assignee: Eaton Corporation, Cleveland, Ohio

[21] Appl. No.: 999,326

[22] Filed: Dec. 31, 1992

[51] Int. Cl.⁶ .......................................... H01H 47/00
[52] U.S. Cl. ............................. 307/134; 307/132 R
[58] Field of Search .............. 307/112, 134, 135, 140, 307/141; 323/218, 367, 370; 364/184; 363/155, 156

[56] References Cited

U.S. PATENT DOCUMENTS

| | | | |
|---|---|---|---|
| 3,700,967 | 10/1972 | Hoss | 361/46 |
| 4,438,472 | 3/1984 | Woodworth | 307/134 |
| 4,573,040 | 2/1986 | Maltby et al. | 340/511 |
| 4,626,698 | 12/1986 | Harden, Jr. et al. | 307/38 |
| 4,748,343 | 5/1988 | Engel | 307/135 |
| 5,061,879 | 10/1991 | Munoz et al. | 315/65 |

*Primary Examiner*—Jeffrey A. Gaffin
*Assistant Examiner*—Peter Ganjoo
*Attorney, Agent, or Firm*—Martin J. Moran

[57] ABSTRACT

False ac signals produced by a noise suppression capacitor across a switch applying a switched ac line voltage signal to a logic input of a microprocessor in an electrical apparatus such as, for example, a contactor or circuit breaker, are phase shifted with respect to a true ac input by inserting two series resistors, and a diode shunting one resistor, between the switch and the logic input. This creates a larger window in which to discriminate between the zero crossings of the true and false ac signals.

12 Claims, 3 Drawing Sheets

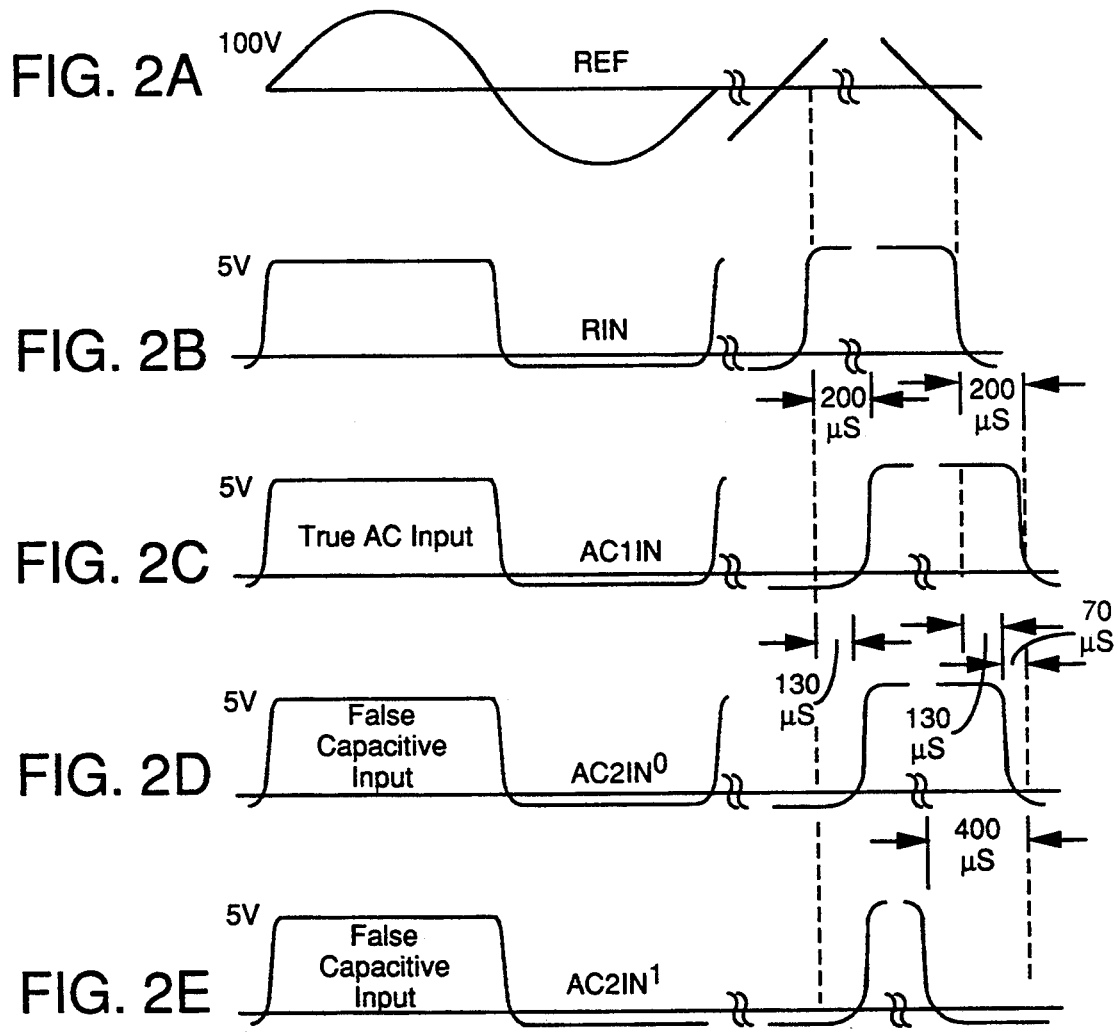
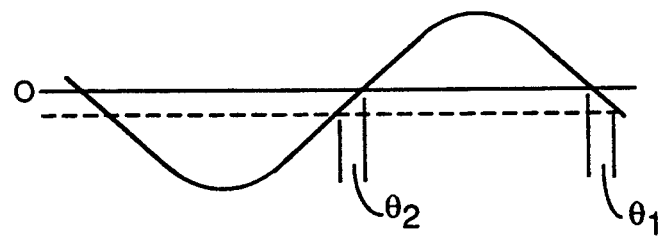
FIG. 3

MICROPROCESSOR BASED ELECTRICAL APPARATRUS WITH FALSE AC INPUT REJECTION

BACKGROUND OF THE INVENTION

1. Field of the Invention

This invention relates to microprocessor based electrical apparatus, such as electrical contactors, having as inputs 120 vac signals switched by switches such as push-button stations or programmable logic controllers protected by noise suppression capacitors which produce false ac inputs when the switch is open. More particularly, the invention is directed to apparatus for detecting true ac input signals to such microprocessor based apparatus, and specifically to apparatus which rejects the false ac signals produced by the noise suppression capacitors when the input switch is open.

2. Background Information

Many types of electrical apparatus for controlling electric power, such as electrical contactors and circuit breakers, now incorporate a microprocessor. For the most part, however, such apparatus is still controlled by 120 vac signals generated by push-button stations or programmable logic controllers (PLC). Typically, the inputs of the microprocessors in these new contactors and circuit breakers have clamping circuits which clip the 120 vac signal at about five volts.

It has been found that capacitively coupled signals can create false inputs for these microprocessor based devices. For instance, U.S. Pat. No. 4,748,343 recognized that parasitic capacitance can couple false ac inputs to the microprocessor. This patent further recognized that the capacitively coupled false signal leads the ac signal and teaches the use of a zero crossing algorithm to discriminate between true and false ac inputs. The zero crossing of the unswitched line voltage is used as the reference for the zero crossings. Due to larger filter capacitors on the inputs to which the switched ac signal is applied, the zero crossings of the true ac signal lag the zero crossings of the reference. On the other hand, capacitively coupled ac signals lead not only the true ac signal but also the reference ac signal. Accordingly, U.S. Pat. No. 4,748,343 teaches a technique in which the ac input is sampled a predetermined time interval after the zero crossing of the reference ac signal. If a signal is detected at this instant, it is a false ac signal.

It is common, and especially in the case of the PLC, to provide a noise suppression network including a shunt capacitor across the switch providing the ac input signal to the microprocessor. This noise suppression capacitor capacitively couples ac to the microprocessor input when the switch is open. The larger this noise suppression capacitor is, the smaller is the angle by which the false signal leads the true ac input. In fact, as the size of the noise suppression capacitor increases, this lead can be reduced so that while the false signal leads the true ac signal, it lags the reference signal. All of this places tighter constraints on the timing of the sampling to discriminate between the true and false ac inputs. Furthermore, less expensive inputs to the microprocessors have less accurate switching thresholds which also decreases the measurement accuracy of the phase shift of the false ac signal.

There is a need therefore for improved apparatus for discriminating between true and false capacitively coupled ac inputs to the microprocessors of electrical apparatus such as contactors and circuit breakers.

More particularly, there is a need for such apparatus which can discriminate between true ac inputs and ac inputs capacitively coupled by sizable noise suppression capacitors shunting switches applying switched ac signals to the microprocessor.

There is a further need for such apparatus which can be used with less expensive microprocessor inputs which have less accurate switching thresholds.

SUMMARY OF THE INVENTION

These and other needs are satisfied by the invention which is directed to microprocessor based electrical apparatus such as, for instance, contactors and circuit breakers having inputs to which ac signals switched by switches shunted by noise suppression capacitors are applied. In accordance with the invention, discrimination means are included between the switch and the microprocessor input to increase the observed phase angle by which the capacitively coupled false ac input leads a true ac input to relax the demands placed on a zero crossing algorithm to time the reading of the ac input. More particularly, the invention utilizes the source of the problem, which is the noise suppression capacitor, to provide the solution. Specifically, means are provided to place a dc bias on the noise suppression capacitor when the switch is open. This is accomplished by inserting two resistors in series between the switch shunted by the noise suppression capacitor, and the ac input to the microprocessor. One of the resistors is shunted by a diode polarized to shift the false ac signal with respect to the true ac signal. Where the microprocessor reads the ac input after a negative to positive zero crossing of a reference ac signal, the diode is polarized to apply a positive bias to the noise suppression capacitor. On the other hand, when the ac input is read following a positive to negative zero crossing of the reference voltage, a negative bias is applied to the noise suppression capacitor to shift the false ac signal forward in time.

BRIEF DESCRIPTION OF THE DRAWINGS

A full understanding of the invention can be gained from the following description of the preferred embodiments when read in conjunction with the accompanying drawings in which:

FIGS. 2A, 2B, 2C and 2D and 2E illustrate a reference ac waveform, the clipped reference input to the microprocessor, a true ac input, a false capacitively coupled ac input without the benefit of the invention, and a false capacitively coupled input with the invention, respectively. The right side of each of these figures illustrates the zero crossings of these waveforms in enlarged scale.

FIG. 3 illustrates the effect of the bias introduced by the invention on the voltage across the noise suppression capacitor shunting a switch providing an ac input to the microprocessor of the contactor.

DESCRIPTION OF THE PREFERRED EMBODIMENTS

The invention will be described as applied to a microprocessor based electrical contactor. It should be understood, however, that the invention is also applicable to other microprocessor based apparatus to which ac signals at line voltage are applied, such as for instance circuit breakers. Furthermore, it should be understood that the term contactor is used herein to embrace not only contactors per se but also contactors with overload protection also referred to as motor starters.

Figure 1:
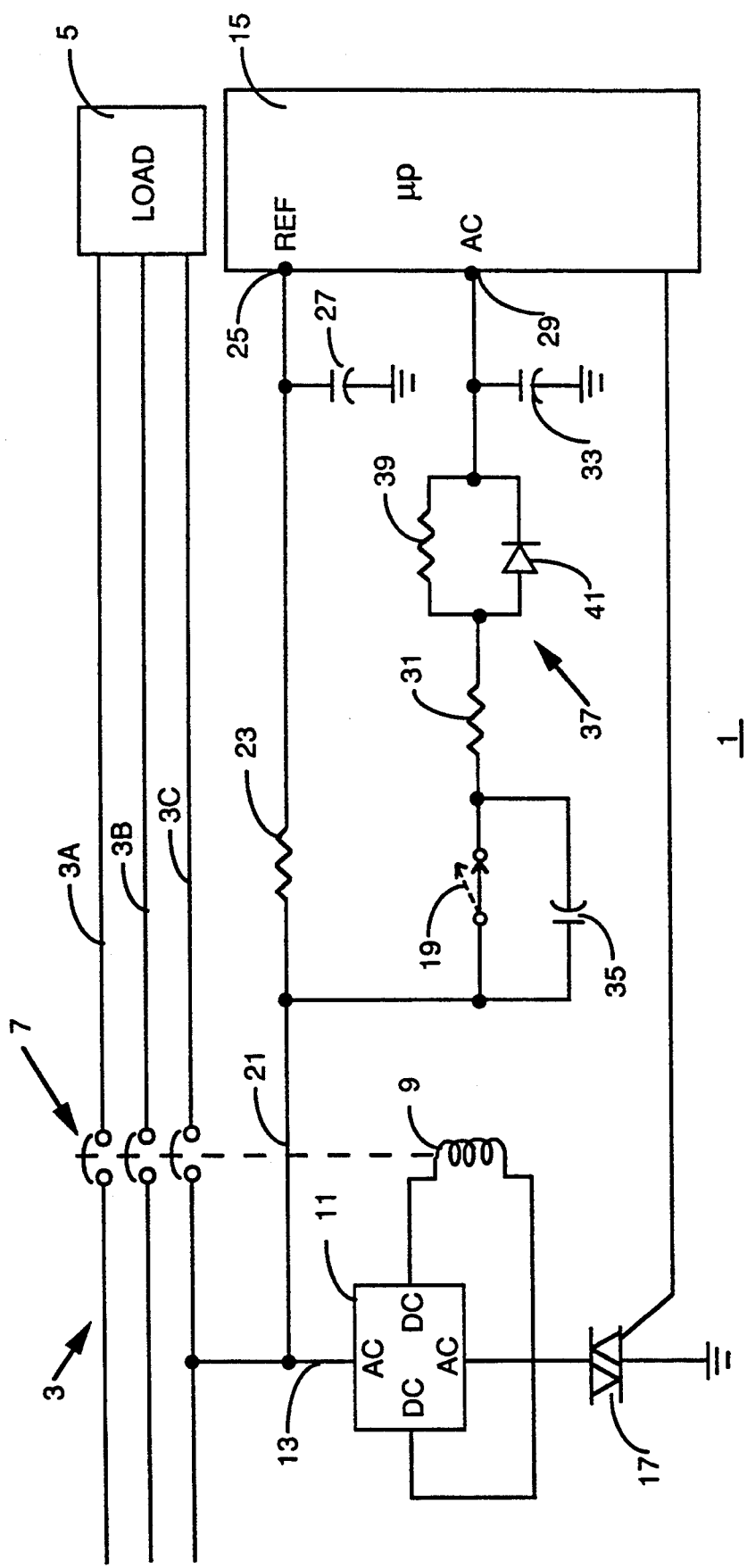
FIG. 1 is a schematic diagram an electrical contactor in accordance with the invention.

Referring to FIG. 1, the contactor 1 controls the flow of electric power supplied by an electrical system 3 having three-phase conductors 3A, 3B and 3C to a load 5. The contactor 1 may be of the type described in U.S. Pat. No. 4,748,343 which is hereby incorporated by reference for a more detailed description of the operation of the contactor. Only those aspects of the contactor which are relevant to the present invention will be discussed herein.

The contactor 1 has main contacts 7 connected in each of the three phase conductors 3A, 3B and 3C. The main contacts 7 are closed by a coil 9 energized by dc power derived by a full wave rectifier 11 from power drawn through a lead 13 from one phase of the electrical system 3.

Energization of the coil 9 is controlled by a microprocessor 15 through a solid state switch 17. The microprocessor 15 in turn can be controlled by external switches such as the switch 19. The switch 19 can be part of a push-button station or can be a switch controlled by a PLC. In any event, the switch 19 switches 120 vac power which may be drawn from one phase of the electrical system 3 through the lead 21. The line voltage on the lead 21 is also applied through input resistor 23 to a reference input 25 of the microprocessor 15. A filter capacitor 27 is connected between the reference terminal 25 and ground.

The ac signal switched by the switch 19 has up to now been applied to an ac input terminal 29 through an input resistor 31. A filter capacitor 33 is connected between the ac input 29 and ground. This filter capacitor 33 is typically larger than a filter capacitor 27.

The ac switch 19 is shunted by a noise suppression network which includes a capacitor 35. As previously discussed, this noise suppression capacitor 35 in parallel with the switch 19, couples a false ac input to the input terminal 29 when the switch 19 is the open position. In accordance with the invention, a discriminator circuit 37 is connected in series between the switch 19 shunted by the noise suppression capacitor 35 and the ac input 29. This discriminator circuit includes the previously provided input resistor 31 in series with a second resistor 39 shunted by a diode 41. Preferably, the resistors 31 and 39 are of equal value.

The microprocessor 15 has additional inputs including additional switched ac inputs; however, their effect on the operation of the microprocessor and the application of the invention thereto will be similar to that which is described herein with regard to the single ac input applied to the input terminal 29.

FIGS. 2A-E illustrate the effect of the noise suppression capacitor 35 on the ac input applied to the terminal 29 and the operation of the invention. FIG. 2A illustrates a cycle of the 120 volt ac signal on the lead 21. As indicated, this voltage REF is supplied to the reference terminal 25 as a reference signal. FIG. 2B illustrates the reference signal which is input to the microprocessor 15. This signal is clipped to a five volt logic level by the input circuitry (not shown) of the microprocessor 15. As the microprocessor 15 only reads positive voltages, the reference signal input RIN alternates between the plus five volt level representing a digital one and a small negative voltage indicating a digital zero input. As can be seen from the right sides of FIGS. 2A and 2B which illustrate the zero crossings of the reference signal and RIN, the filter capacitor 27 causes the RIN signal to lag the REF signal. In the exemplary microprocessor where the filter capacitor 27 is 0.01 μf, this lag is approximately 100 μs.

FIG. 2C illustrates the waveform for a true ac input AC1IN applied to the input terminal 29. That is, the signal input to the microprocessor 15 when the switch 19 is closed. Again, this signal is clipped between +5 volt and slightly negative logic levels. The filter capacitor 33, being larger than the filter capacitor 27, causes a greater lag in the ac input signal AC1IN. In the exemplary contactor where the filter capacitor 33 has a value of 0.033 μf, the true ac input signal AC1IN lags the reference input signal RIN by about 200 μs.

When the switch 19 is open, the noise suppression capacitor 35 capacitively couples the false ac signal AC2IN shown in FIG. 2D to the ac input terminal 29. This signal, in the absence of the resistor 39 shunted by the diode 41 leads the true ac input AC1IN. For a noise suppression capacitor 35 of 1.0 μf, the false capacitively coupled input signal AC2IN is shifted with respect to the true ac input signal AC1IN so that it lags the reference signal RIN by 130 μs. Thus, the false capacitively coupled input signal AC2IN leads the true ac input signal AC1IN, by 70 μs in the exemplary contactor. This offers a very narrow window in which to discriminate between a true ac input and a false ac input, and the problem is compounded by the fact that the rise times of these signals, being clipped ac signals, are not sharp.

Adding the discriminator circuit 37, which includes the resistor 39 shunted by the the diode 41 in addition to the resistor 31, phase shifts the false ac signal so that it leads the true ac signal by a much greater amount. As is shown in FIG. 2E, the inclusion of the discriminator circuit 37 causes the positive to negative zero crossing of the false ac input signal AC2IN' to lead the corresponding zero crossing of the true ac input by about 400 μs. As the zero crossing of the true ac signal occurs 200 μs after the reference input RIN, and the false ac input occurs 400 μs before the true ac input, in the exemplary system, the ac input is read 100 μs after the reference input RIN zero crossing is detected. If a low level logic signal is detected, then the ac input is a true ac input signal. If the high level logic signal is read, it is a false ac input.

The present invention increases the lead of the false ac input with respect to the true ac input by applying a dc bias to the noise suppression capacitor 35 which is generating the false ac input. When the ac signal on the lead 21 forward biases the diode 41, the capacitor 35 charges more rapidly (because the resistor 39 is shunted by the diode 41) than it charges when the ac signal is of the opposite polarity. With the polarity of the diode 41 as shown in FIG. 1, that is with the anode toward the noise suppression capacitor 35 and the cathode toward the input terminal 29, a negative bias is applied to the capacitor 35. As shown in FIG. 3, with the false ac signal shifted downward by the negative dc bias, there is an effective leading phase shift $\theta_1$, with regard to the positive to negative zero crossings. It can also be seen that with this polarity of bias, there is a lagging phase shift $\theta_2$, of the negative to positive zero crossing of the false ac signal. Thus, if the ac input is to be read following negative to positive zero crossings, the polarity of the diode 41 should be reversed to apply a positive bias to the noise suppression capacitor 35.

Figure 4:
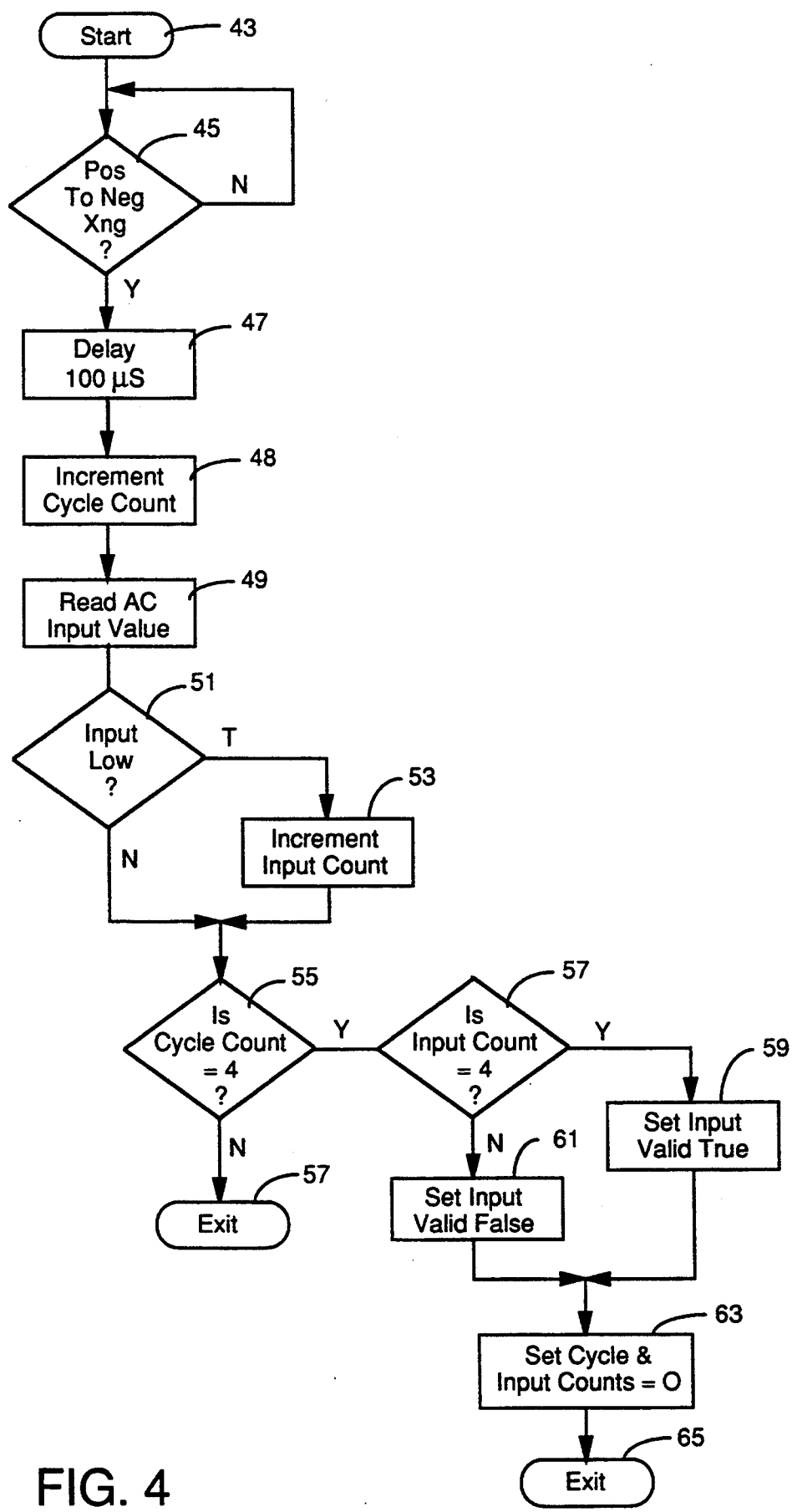
FIG. 4 is a flow chart for a computer program suitable for implementing the invention.

The flow chart for a program run by the microprocessor 15 to read the ac input applied to the input terminal 29 is shown in FIG. 4. This routine is initiated by a zero crossing interrupt at 43. Upon the detection of a positive to negative zero crossing at 45, a delay of 100 μs is initiated at 47, a cycle count is incremeted at 48 and then the ac input value is read at 49. This routine recognizes a valid ac input only after a true ac input is detected for four consecutive readings (i.e., four cycles). Thus, if the input is low as determined at 51, an input count is incremented at 53. In any event, a cycle count is checked at 55. If this cycle count is not equal to four indicating that four readings have not been taken in a set, the program is exited at 57 and waits for the next interrupt.

When four cycles have been counted at 55, a check is made at 57 to determine whether a low input was detected on each of those four cycles. If the input count is equal to four an input valid flag is set true at 59, otherwise it is set false at 61. In any case, both the cycle count and the input count are zeroed at 63 before the program is exited at 65. Thus, a valid ac input signal is only acknowledged if a true ac signal is detected on four consecutive cycles of the reference voltage.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. An electrical apparatus for controlling an electrical load in response to an ac voltage signal switched by a switch shunted by a noise suppression capacitor which produces, when said switch is open, a false signal leading by a predetermined interval a true ac switched signal produced when said switch is closed, said apparatus comprising:
    a microprocessor having an input filter and an input terminal to which said ac voltage switched by said switch is applied, and means periodically reading said ac voltage switched by said switch applied to said input terminal; and
    discriminating means connected between said switch and said input terminal increasing said interval by which said false signal leads said true ac switched signal, said means periodically reading said ac voltage reading ac voltage applied to said input terminal during said interval.

2. The apparatus of claim 1 wherein said discriminating means comprises means applying a dc bias to said noise suppression capacitor when said switch is open.

3. The apparatus of claim 2 wherein said means applying said dc bias comprises first and second resistors connected in series between said switch shunted by said noise suppression capacitor and said input terminal, and a diode connected in parallel with said second resistor.

4. The apparatus of claim 1 wherein said microprocessor further includes a reference input to which said ac voltage is applied as a reference signal and means detecting zero crossings of said reference signal, and wherein said means periodically reading said ac voltage delays reading voltage at said input terminal for a period selected to fall within said predetermined interval by which said false ac signal leads said true ac switched signal.

5. The apparatus of claim 4 wherein said discriminating means comprises means applying a dc bias to said noise suppression capacitor when said switch is open.

6. The apparatus of claim 5 wherein said means detecting zero crossings of said reference signal detects negative to positive zero crossings, and wherein said means applying said dc bias to said noise suppression capacitor applies a positive dc bias.

7. The apparatus of claim 5 wherein said means detecting zero crossings of said reference signal detects positive to negative crossings, and wherein said means applying a bias to said noise suppression capacitor applies said dc a negative dc bias.

8. The apparatus of claim 5 wherein said means applying said dc bias to said noise suppression capacitor comprises first and second resistors connected in series between said switch shunted by said noise suppression capacitor and said input terminal, and a diode connected in parallel with said second resistor.

9. The apparatus of claim 8 wherein said first and second resistors have approximately the same value.

10. The apparatus of claim 8 wherein said diode has an anode connected toward said switch and a cathode connected toward said input terminal and wherein said means detecting zero crossings of said reference signal detects positive to negative zero crossings.

11. The apparatus of claim 8 wherein said diode has a cathode connected toward said switch shunted by said noise suppression capacitor, and an anode connected toward said input terminal, and wherein said means detecting zero crossings of said reference signal detects negative to positive zero crossings.

12. The apparatus of claim 4 including a first filter capacitor connected between said reference terminal and ground and a second filter capacitor connected between said input terminal and ground, said second filter capacitor having a larger capacitance than said first filter capacitor.

* * * * *